June 19, 1956 R. W. KETCHLEDGE 2,751,442

DISTORTIONLESS FEEDBACK AMPLIFIER

Filed Sept. 26, 1952 2 Sheets-Sheet 1

INVENTOR
R. W. KETCHLEDGE
BY H. A. Burgess
ATTORNEY

DISTORTIONLESS FEEDBACK AMPLIFIER

Filed Sept. 26, 1952

INVENTOR
R. W. KETCHLEDGE
BY H. A. Burgess
ATTORNEY

United States Patent Office 2,751,442

Patented June 19, 1956

2,751,442

DISTORTIONLESS FEEDBACK AMPLIFIER

Raymond W. Ketchledge, Middlesex, N. J., assignor to Bell Telephone Laboratories, Incorporated, New York, N. Y., a corporation of New York Application September 26, 1952, Serial No. 311,580

4 Claims. (Cl. 179—171)

Figure 1:
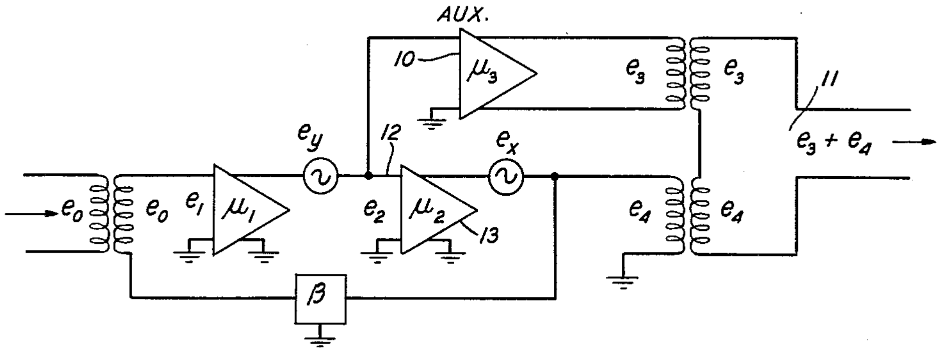

This invention relates to amplification with gain-reducing feedback for distortion-reduction purposes and provides a still further reduction in noise or distortion over and beyond what is attainable by usual or known feedback practices.

It is well known in the art that the distortion level in the output of an amplifier can be reduced by negative feedback of the output waves to the input of the amplifier. The fed-back waves combine with the input waves to produce resultant waves which have a relatively high level of distortion. This situation holds for the waves from the point where these resultant waves are first produced right up to their point of application to the grid of the final stage, whether the amplifier is comprised of but one stage or has several stages. It is because of this relatively large distortion content in the waves in the mu circuit ahead of the grid of the final stage that effective cancellation of distortion in the final stage occurs.

If the phase relations of the signal and distortion components at the grid of the final stage be considered it will be noted that they are such that when the waves are repeated into the output path of this stage the signal will be in aiding phase with the signal originally present whereas the distortion will be in substantially opposite phase to that generated in the output of the tube.

The invention takes advantage of these phase relations and of the existence of relatively high distortion level in the mu path of a feedback amplifier to secure a still further reduction in distortion than is achieved by the negative feedback alone.

In accordance with the invention, some of the waves resulting from combining the input waves and fed-back waves are transmitted around the final stage, or around the only stage if the amplifier has but one stage, to the load circuit, with a phase reversal, so that the desired wave components so transmitted augment the desired wave components in the load while the distortion components thus transmitted reduce the distortion level in the load.

The general object of the invention is to improve the operation of feedback amplifiers by securing a reduction in distortion in the output waves below the distortion level due to the use of feedback alone.

Typical circuits for practicing the invention are shown in the drawing and will be described.

Figure 2:
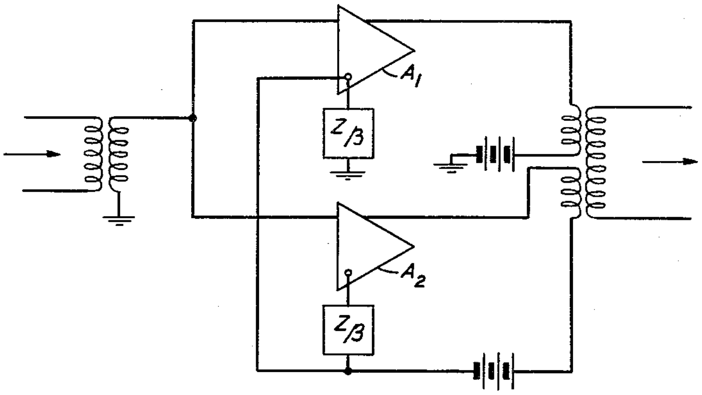
Figure 3:
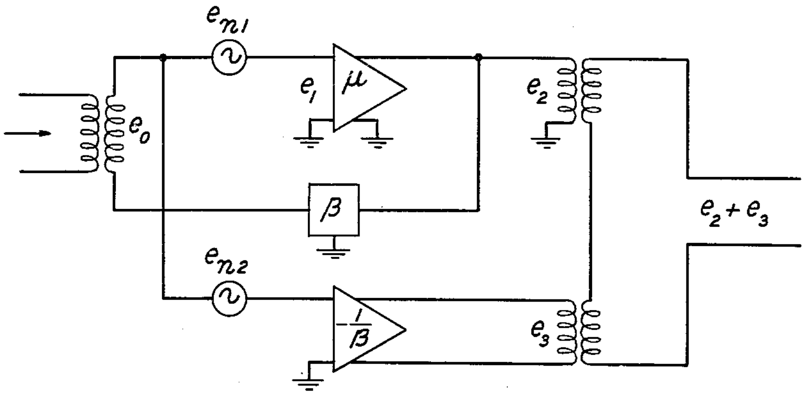

In the drawing, Figs. 1, 2 and 3 are block diagrams illustrating the principles of operation of the invention.

Figure 4:
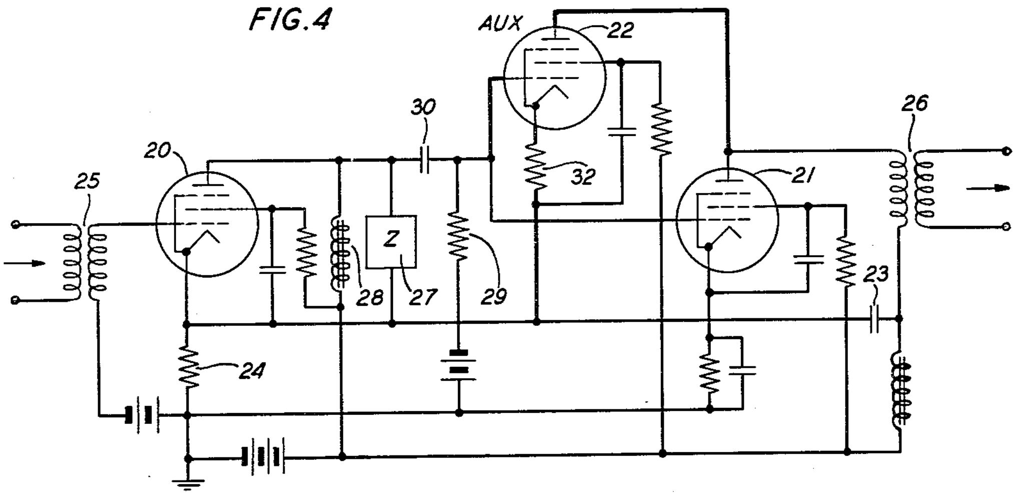
Figure 5:
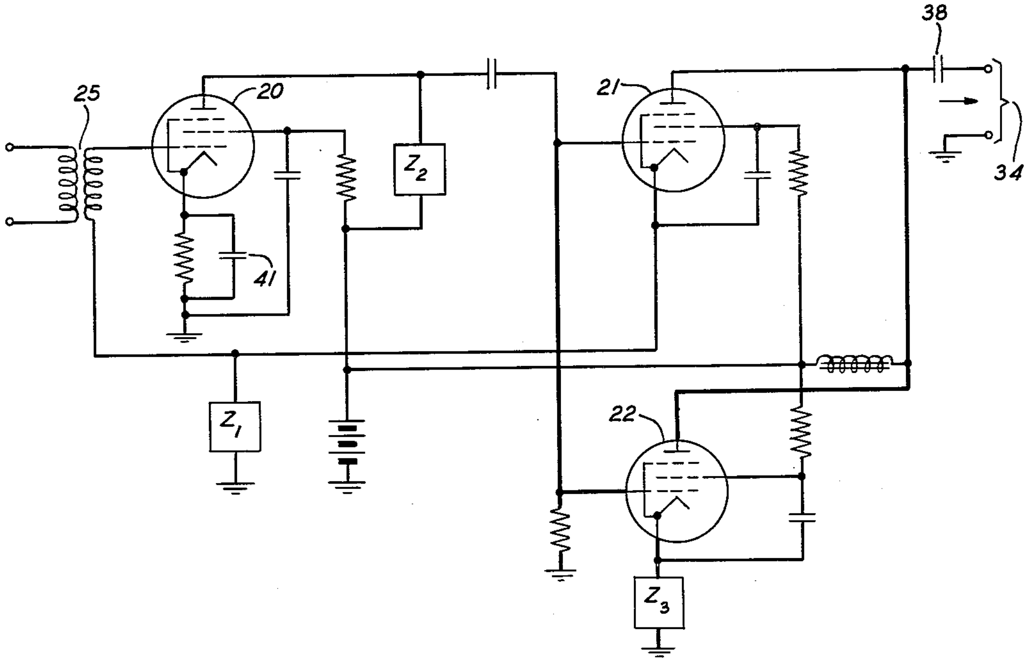

Fig. 4 is a schematic circuit diagram of one type of amplifier embodying the invention and Fig. 5 is a similar diagram of another type of amplifier using the invention.

Fig. 1 is conventional except for the auxiliary amplifier 10 and its manner of coupling to the outgoing or load circuit 11 and to the interstage circuit 12. Auxiliary amplifier 10 picks off interstage waves in which the distortion components are relatively high due to feedback action in the main amplifier, amplifies these waves, reverses their phase in the same manner as does output stage

13 and impresses them on line 11 in such manner as to contribute to the wanted or signal output but to reduce the unwanted or distortion in the line 11, but the output couplings are such that none of the output of amplifier 10 appears across the beta impedance. The generators $e_x$ and $e_y$ represent noise or distortion sources associated with $\mu_2$ and $\mu_1$. The amplifier 13 delivers an amplified replica of the interstage signal, $e_2$, to the output circuit.

The requirements for balance, that is, the value of $\mu_3$ to prevent $e_x$ or $e_y$ from appearing in $e_3+e_4$, are easily derived.

By inspection $$e_1=e_0+\beta e_4 \qquad (1)$$

$$e_2=e_1\mu_1+e_y \qquad (2)$$

$$e_3=\mu_3 e_2 \qquad (3)$$

$$e_4=\mu_2 e_2+e_x \qquad (4)$$

From 1–4 it is possible to derive $$e_4=\frac{\mu_1\mu_2}{1-\mu_1\mu_2\beta}e_0+\frac{\mu_2 e_y+e_x}{1-\mu_1\mu_2\beta} \qquad (5)$$

and $$e_3=\frac{\mu_1\mu_3}{1-\mu_1\mu_2\beta}e_0+\frac{\mu_3}{1-\mu_1\mu_2\beta}e_y+\frac{\mu_1\mu_3\beta}{1-\mu_1\mu_2\beta}e_x \qquad (6)$$

Therefore, the combined output becomes $$e_3+e_4=\frac{(\mu_1\mu_2+\mu_1\mu_3)e_0+(\mu_2+\mu_3)e_y+(1+\mu_1\mu_3\beta)e_x}{1-\mu_1\mu_2\beta} \qquad (7)$$

If $$\mu_3=-\frac{1}{\mu_1\beta} \qquad (8)$$

the $e_x$ term vanishes and neglecting $e_y$ the output becomes $$e_3+e_4=\frac{\mu_1\mu_2-\frac{1}{\beta}}{1-\mu_1\mu_2\beta}e_0=-\frac{1}{\beta}e_0 \qquad (9)$$

Because in the original feedback amplifier in which $$\mu_1\mu_2\beta>>1 \qquad (10)$$

the external gain was likewise $$\frac{1}{\beta}e_0$$

the addition of the auxiliary amplifier in accordance with this invention does not disturb the overall signal gain but does appreciably reduce the distortion level in the output.

In practice it is desirable to avoid balance deviations due to gain changes of tubes so if $\mu_1$ is eliminated as a variable, $\mu_1=1$, the $\mu_3$ circuit need be balanced only against the passive $\beta$ network. Further, since the external gain of a feedback amplifier is very nearly $$\frac{1}{\beta}$$

the $\mu_3$ circuit might be composed of an amplifier similar to the main amplifier and thereby a balance fairly immune to tube variations obtained. Such an arrangement is indicated on Fig. 2.

The main amplifier of Fig. 2 is labeled $A_1$, and the auxiliary amplifier $A_2$. The cathode feedback arrangement permits the input to $A_2$ to be connected between grid and cathode of the first tube of the main amplifier, $A_1$. Since $A_2$ has the same value of cathode feedback impedance $Z_\beta$ it delivers an output which, for the signals from the input transformer, is lower in level by the amount of the feedback and therefore, its presence does not appreciably disturb the operation of $A_1$ except for the added tube capacities. Pentode output stages having high plate resistance prevent interaction between the combined outputs while the balanced output transformer will combine the amplifiers in the proper sense.

This arrangement provides an additional 3 decibels of output power, yet the noise level is not increased because of the cancellation effect. The improvement is obtained at the expense of adding a duplicate amplifier circuit. However, should $A_1$ fail, the $A_2$ amplifier will take over the circuit with substantially the same gain but with the modulation performance of the single feedback amplifier. It would appear to be advantageous to use a structure of this type rather than parallel tubes where the object is to retain continuity of service. Also, in a submarine cable system such a scheme would provide, in effect, spare repeaters to avoid circuit failure.

It is of interest to note the effect on "first stage" noise due to the auxiliary circuit. Consider Fig. 3, in which two noise sources $e_{n1}$ and $e_{n2}$ are present at the inputs of the two amplifiers.

By inspection $$e_1 = e_0 + \beta e_2 + e_{n1} \qquad (11)$$

$$e_2 = \mu e_1 \qquad (12)$$

$$e_3 = -\frac{1}{\beta}[e_0 + \beta e_2 + e_{n2}] \qquad (13)$$

By elimination of $e_1$ this becomes $$e_2 = \frac{\mu}{1-\mu\beta}e_0 + \frac{\mu}{1-\mu\beta}e_{n1} \qquad (14)$$

$$e_3 = \frac{1}{\beta}e_0 - \frac{\mu}{1-\mu\beta}e_0 - \frac{\mu}{1-\mu\beta}e_{n1} - \frac{e_{n2}}{\beta} \qquad (15)$$

so by addition of $e_2$ and $e_3$ an output is formed in which $$e_3 + e_4 = -\frac{1}{\beta}e_0 - \frac{e_{n2}}{\beta} \qquad (16)$$

Thus the noise of the main amplifier is eliminated but the lower level noise of the auxiliary amplifier is introduced so that in practice the net noise figure is improved.

It should also be noted that in all cases, the so-called $\mu\beta$ effect is eliminated in the main amplifier. Thus the auxiliary amplifier removes the noise, distortion and $\mu\beta$ effect from the main amplifier and substitutes the corresponding effects from an identical amplifier operating at a lower output level, lower by the amount of feedback existing in the main amplifier. Then should the main amplifier lose its internal gain the auxiliary amplifier takes over the main signal. Should the auxiliary amplifier lose its gain the main amplifier still functions normally. It should be noted that the auxiliary amplifier may also be a double arrangement of this distortionless type whose auxiliary in turn may be a double arrangement and so on.

In each of Figs. 1, 2 and 3 a hybrid coil coupling could be made from the outputs of main and auxiliary amplifiers to the load to avoid undesired flow of waves from the output of the auxiliary amplifier to the beta circuit of the main amplifier.

The auxiliary tube can have its input connected to pick off the voltage at any point in the mu circuit ahead of the power stage. If it picks the voltage off on the input side of the first stage of a multistage amplifier, more gain must be used in the compensating or auxiliary branch of the circuit. One advantage to be realized from picking the compensating voltage off ahead of the first stage is that the gain stability of the entire amplifier is improved by the auxiliary circuit. Where the distortion originating in the power stage is the main source of trouble, the voltage for the compensating tube should be taken off immediately ahead of the power stage.

Fig. 4 is a two-stage amplifier with negative feedback coupling from the plate of the second stage to the cathode of the first stage. The feedback is by way of condenser 23 to the ungrounded terminal of resistor 24 which is the beta impedance in this case, the grid of the first stage being returned to ground.

The main amplifier comprises tubes 20 and 21, which are shown as pentodes, together with input coupling 25, output coupling 26, feedback coupling 23, 24 already referred to, and interstage coupling including shunt impedances 28 and 29 and series coupling condenser 30.

The auxiliary amplifier comprises pentode 22 with its grid connected to the grid of tube 21 and its plate connected to the plate of tube 21. Its cathode is connected to the cathode of tube 20. The tube 20 works into an external impedance 27 which may comprise a resistance or reactive impedance or a combination of resistive and reactive impedances as may be necessary in any case to assist in imparting to the amplifier as a whole a desired characteristic. The voltage developed across impedance 27 is applied to the input terminals of tube 22 and is also applied to the input of tube 21 supplemented by the voltage across the beta resistor 24. The output circuit for tube 21 includes condenser 23 and resistor 24. The output circuit for tube 22 includes condenser 23 but does not includes the feedback resistor 24.

In the operation of the circuit of Fig. 4, the terminal couplings 25 and 26 may lead to broad band transmission equipment such as coaxial cables using megacycles of band width. Negative feedback is provided at 23, 24 of such amount that the amplification over the whole band is nearly equal to the reciprocal of the feedback ratio. A high degree of linearity and stability is thus obtained by means of the feedback. Still further improvement in linearity and stability is obtained by use of the auxiliary amplifier 22 according to the invention, in the manner already described in connection with Figs. 1, 2 and 3. Waves across an interstage point, containing variables such as distortion, noise, and instability effects that are reduced in the final output by the negative feedback, are impressed on the grid of auxiliary tube 22 which has its output electrodes effectively connected across output coupling 26. Since a phase reversal occurs in tube 22 similar to that in tube 21 between input and output waves, partial cancellation occurs in coupling 26 of the distortion, noise, and instability variables which remain after the feedback action in the main amplifier. A considerable improvement in the level of disturbing energy in the outgoing circuit is thus achieved.

It is to be noted that the auxiliary amplifier 22 is not connected actually in parallel with stage 21, for tube 21 includes feedback impedance 24 in its external plate circuit whereas tube 22 does not. Tube 22 does not therefore take part in the feedback action of the main amplifier but rather supplements the feedback action by producing a still further improvement in the performance of the main amplifier.

In Fig. 5 the main amplifier comprises tubes 20 and 21 while the auxiliary tube is shown at 22, the arrangement being generally analogous to that of Fig. 4. The feedback impedance or beta network $Z_1$ is included in the output circuit of tube 21 and the input circuit of tube 20 in such manner as to produce negative feedback of output waves from tube 21 to the grid of tube 20. The path for these waves is from the plate of tube 21 through output coupling condenser 38, load impedance (not shown) connected to the output leads 34, ground, and $Z_1$ to cathode of tube 21. The voltage developed across impedance $Z_1$ due to these waves is applied between the cathode of tube 20, which is grounded through by-pass capacity 41, and the grid, in such sense as to reduce the gain of the two stage amplifier 20, 21 for the waves being amplified thereby. The plate coupling impedance $Z_2$ in the interstage path may be resistive or reactive or both in character as described in connection with Fig. 4. The voltage developed across $Z_2$ between ground and the anode of tube 20 is applied to the grid of tube 21 and also to the grid of tube 22. The ground return is through impedance $Z_1$ to the cathode of tube 21 and through an impedance $Z_3$ to the cathode of tube 22. This impedance $Z_3$ furnishes a negative feedback coupling between plate and grid circuits of tube 22 for the purpose of linearizing that tube. Anodes of tubes 21 and 22 are directly connected together. Impedance $Z_1$ is in the main feedback loop of the amplifier but is not in any feedback loop around tube 22. Therefore, as in the previously discussed embodiments, the auxiliary tube 22 does not take part in the feedback action of the main amplifier but supplements such action by further contributing an improvement in the performance of the main amplifier.

The invention is susceptible of wide variation in circuitry while still using the principle and securing the advantages of the invention, so that the embodiments disclosed herein are not to be construed as limiting but rather are illustrative examples.

What is claimed is:

1. An amplifier including a pair of tubes each having at least the elements of a triode, and having their control grids connected together and their anodes connected together, a load coupling, a feedback impedance, a path for signal waves extending from the common anode connection through said load coupling to the cathode of the first tube, and in series through said feedback impedance to the cathode of said second tube, an input signal source having a pair of terminals, a connection from one of said terminals to the cathode of said second tube and a signal wave-transfer path from said other terminal to the common grid connection of said tubes.

2. In a signal amplifier, an input circuit for a signal to be amplified, an amplifier stage having an output circuit in which distortion arises, a gain-reducing feedback path for signal and distortion components around said amplifier including a feedback impedance common to said input and output circuits, a load circuit for said amplifier, means for reducing the distortion appearing in said load circuit comprising an auxiliary amplifier, an input circuit for said auxiliary amplifier, means coupling the input circuit of said auxiliary amplifier to said signal amplifier ahead of said stage at a point at which said fed-back signal and distortion components appear, an output circuit for said auxiliary amplifier independent of said feedback path, and means for coupling the output circuits of said stage and said auxiliary amplifiers to said load circuit in opposing phase for said distortion but in aiding phase for said signal.

3. In combination, a multistage signal amplifier having an input and an output circuit, a source of signal waves connected to said input circuit, a stage in said output circuit in which distortion waves are generated, a load circuit for utilizing the output waves from said amplifier, a feedback path common to said input and output circuits for coupling a portion of said output waves to said input circuit in such phase as to reduce the distortion waves appearing in said output circuit, an interstage point in said amplifier ahead of the said stage in which distortion waves are generated, auxiliary amplifier means for the combined signal and distortion waves appearing at said interstage point, an input circuit for said auxiliary amplifier, means for coupling said input circuit to said interstage point, an output circuit for said auxiliary amplifier independent of said feedback path, said auxiliary amplifier having an amplification such that the distortion waves appearing in its output circuit are substantially equal in magnitude to the distortion waves appearing in the output circuit of said signal amplifier, and means for coupling the output circuits of said signal and auxiliary amplifiers to said load circuit in such fashion as to combine the distortion components in said output circuits in subtractive phase and the signal components in additive phase.

4. A signal amplifier having an input circuit, an output circuit, and an amplifier stage in which distortion appears, a feedback path interconnecting said input and output circuits for supplying a fraction $\beta$ of the signal and distortion waves in said output circuit to said input circuit in such phase as to reduce the distortion in said output circuit, an interstage connection point in said amplifier preceding said stage and at which combined signal and distortion waves appear, the gain of said amplifier between said input and said point being $\mu$, a load circuit for said amplifier, an auxiliary amplifier for transmitting a portion of the combined waves at said interstage point around said stage, said auxiliary amplifier having a gain equal to the negative reciprocal of the product of $\mu$ and $\beta$, an input circuit for said auxiliary amplifier coupled to said interstage point, an output circuit for said auxiliary amplifier independent of said feedback path, means for coupling the output circuits of said signal and auxiliary amplifiers to said load circuit in aiding phase for said signal and in opposing phase for said distortion.

References Cited in the file of this patent

UNITED STATES PATENTS

| | | |
|---|---|---|
| 2,183,731 | Wright | Dec. 19, 1939 |
| 2,271,876 | Seeley | Feb. 3, 1941 |
| 2,379,669 | Ford | July 3, 1945 |
| 2,579,071 | Hansell | Dec. 18, 1951 |
| 2,605,333 | Job | July 29, 1952 |